US012676603B2

(12) United States Patent
Terryn

(10) Patent No.: US 12,676,603 B2
(45) Date of Patent: Jul. 7, 2026

(54) HIGH SPEED DYNAMIC COMPARTOR

(71) Applicant: SEMICONDUCTOR COMPONENTS INDUSTRIES, LLC, Scottsdale, AZ (US)

(72) Inventor: Steven Terryn, De Pinte (BE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 91 days.

(21) Appl. No.: 18/667,217

(22) Filed: May 17, 2024

(65) Prior Publication Data

US 2025/0357923 A1     Nov. 20, 2025

(51) Int. Cl.
| | |
|---|---|
| *H03K 5/22* | (2006.01) |
| *H03K 5/24* | (2006.01) |
| *H03K 19/20* | (2006.01) |
| *H03M 1/34* | (2006.01) |

(52) U.S. Cl.
CPC ........... *H03K 5/2481* (2013.01); *H03K 5/249* (2013.01); *H03K 19/20* (2013.01); *H03M 1/34* (2013.01)

(58) Field of Classification Search
CPC ............ H03K 3/02; H03K 3/023; H03K 5/22; H03K 5/24; H03K 5/2472; H03K 5/2481; H03K 5/249; H03K 19/20; H03M 1/34
See application file for complete search history.

(56) References Cited

U.S. PATENT DOCUMENTS

| | | | |
|---|---|---|---|
| 10,666,243 B2 | 5/2020 | Xu | |
| 10,855,305 B2 | 12/2020 | Eitan | |

| | | | |
|---|---|---|---|
| 11,133,812 B1 | 9/2021 | Lebedev | |
| 2013/0176156 A1* | 7/2013 | Danjo | .................... H03K 5/249 |
| | | | 327/64 |
| 2023/0344346 A1* | 10/2023 | Li | ....................... H02M 1/0032 |

FOREIGN PATENT DOCUMENTS

| | | | |
|---|---|---|---|
| CN | 105162441 B | 11/2017 | |
| CN | 108832916 A * | 11/2018 | ............. H03K 5/249 |
| CN | 114520650 A | 5/2022 | |

OTHER PUBLICATIONS

Agyenya Anand et al., "Performance Analysis of Fast & Power Efficient Dynamic Comparator Topologies," 2024 2nd International Conference on Device Intelligence, Computing and Communication Technologies (DICCT), IEEE, Mar. 15, 2024 (Mar. 15, 2024), pp. 654-658.

* cited by examiner

*Primary Examiner* — Long Nguyen
(74) *Attorney, Agent, or Firm* — Slayden Grubert Beard PLLC

(57) ABSTRACT

A comparator is disclosed. The comparator includes an amplifier circuit, a latch circuit, and a boost circuit. The amplifier is configured to amplify a difference between the first and second differential inputs during an active phase of the comparator. The latch circuit includes first and second transistors, respectively coupled to first and second differential amplifier outputs, and configured to respectively drive first and second legs of the latch circuit during the active phase. The boost circuit includes first and second boost transistors respectively coupled to the first and second differential amplifier outputs, and configured to respectively provide a first supplemental current to the first differential output of the latch circuit and a second supplemental current to the second differential output of the latch circuit.

18 Claims, 5 Drawing Sheets

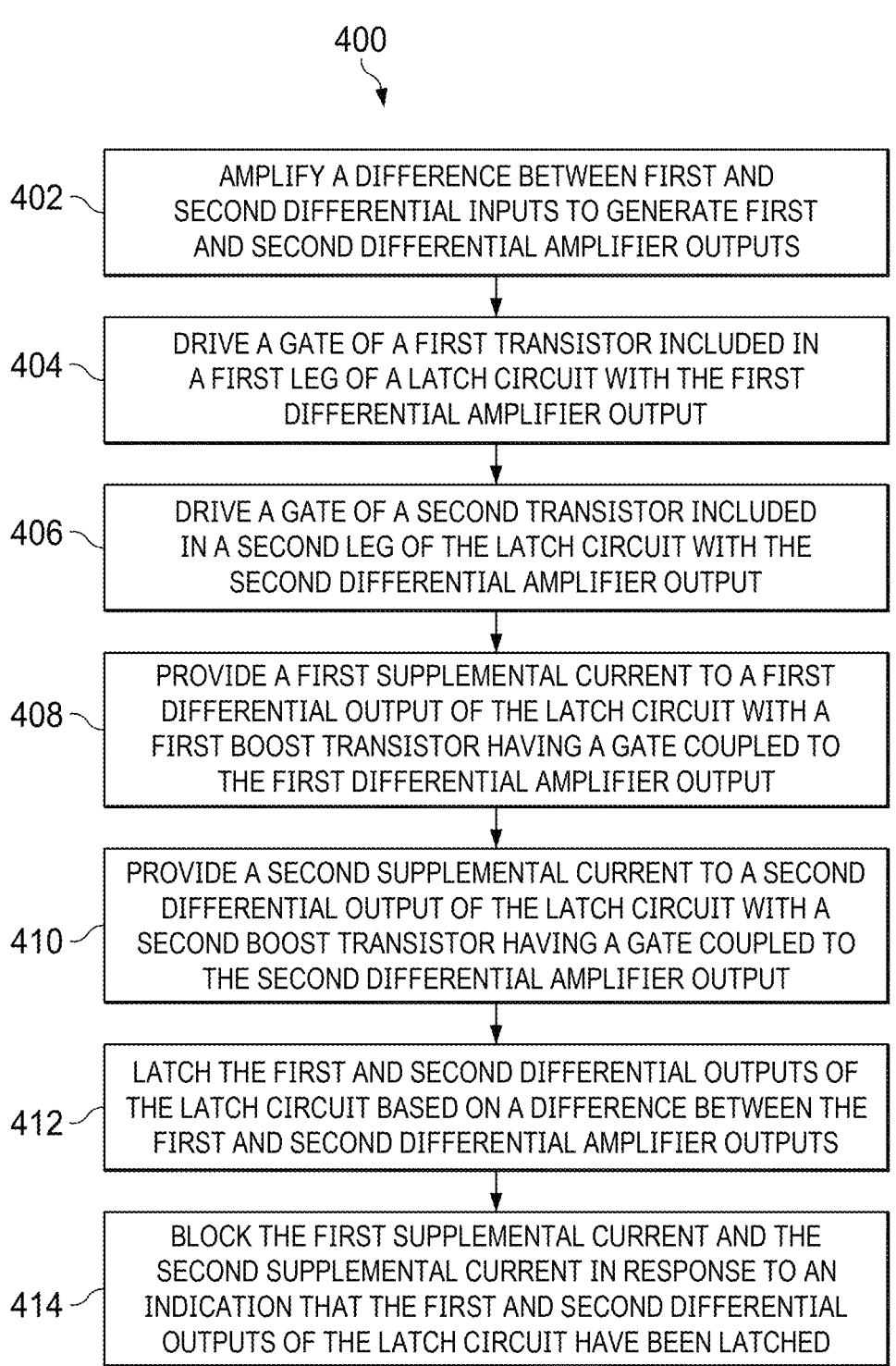

400

402 — AMPLIFY A DIFFERENCE BETWEEN FIRST AND SECOND DIFFERENTIAL INPUTS TO GENERATE FIRST AND SECOND DIFFERENTIAL AMPLIFIER OUTPUTS

404 — DRIVE A GATE OF A FIRST TRANSISTOR INCLUDED IN A FIRST LEG OF A LATCH CIRCUIT WITH THE FIRST DIFFERENTIAL AMPLIFIER OUTPUT

406 — DRIVE A GATE OF A SECOND TRANSISTOR INCLUDED IN A SECOND LEG OF THE LATCH CIRCUIT WITH THE SECOND DIFFERENTIAL AMPLIFIER OUTPUT

408 — PROVIDE A FIRST SUPPLEMENTAL CURRENT TO A FIRST DIFFERENTIAL OUTPUT OF THE LATCH CIRCUIT WITH A FIRST BOOST TRANSISTOR HAVING A GATE COUPLED TO THE FIRST DIFFERENTIAL AMPLIFIER OUTPUT

410 — PROVIDE A SECOND SUPPLEMENTAL CURRENT TO A SECOND DIFFERENTIAL OUTPUT OF THE LATCH CIRCUIT WITH A SECOND BOOST TRANSISTOR HAVING A GATE COUPLED TO THE SECOND DIFFERENTIAL AMPLIFIER OUTPUT

412 — LATCH THE FIRST AND SECOND DIFFERENTIAL OUTPUTS OF THE LATCH CIRCUIT BASED ON A DIFFERENCE BETWEEN THE FIRST AND SECOND DIFFERENTIAL AMPLIFIER OUTPUTS

414 — BLOCK THE FIRST SUPPLEMENTAL CURRENT AND THE SECOND SUPPLEMENTAL CURRENT IN RESPONSE TO AN INDICATION THAT THE FIRST AND SECOND DIFFERENTIAL OUTPUTS OF THE LATCH CIRCUIT HAVE BEEN LATCHED

FIG. 4

HIGH SPEED DYNAMIC COMPARTOR

TECHNICAL FIELD

The disclosure relates generally to electrical circuits, and particularly to a dynamic comparator.

BACKGROUND

An analog-to-digital converter (ADC) is an electrical circuit that may convert an analog input signal into a digital signal that represents the value of the analog signal. One of the building blocks for constructing an ADC may be a dynamic comparator. Dynamic comparators may provide a power-efficient comparison function. For example, dynamic comparators may consume current during a comparison step of an ADC but may otherwise avoid the use of bias currents that cause static current consumption.

Dynamic comparators may include a latching stage that generates a full-scale output voltage at the output of the comparator. The inventor of embodiments of the present disclosure has recognized that such a latching stage may be slow to latch due to one or more factors, for example, semiconductor process variation and other non-ideal conditions such as low supply voltage and low temperature. The inventor of embodiments of the present disclosure has also recognized that means for improving the speed of the latching stage may be limited by a requirement to have no static current consumption and more generally to not deteriorate the power-efficiency of the comparator. Embodiments of the present disclosure may address one or more of these challenges.

BRIEF DESCRIPTION OF THE DRAWINGS

A more complete understanding of the present embodiments may be acquired by referring to the following description taken in conjunction with the accompanying drawings, in which like reference numbers indicate like features.

Figure 1:
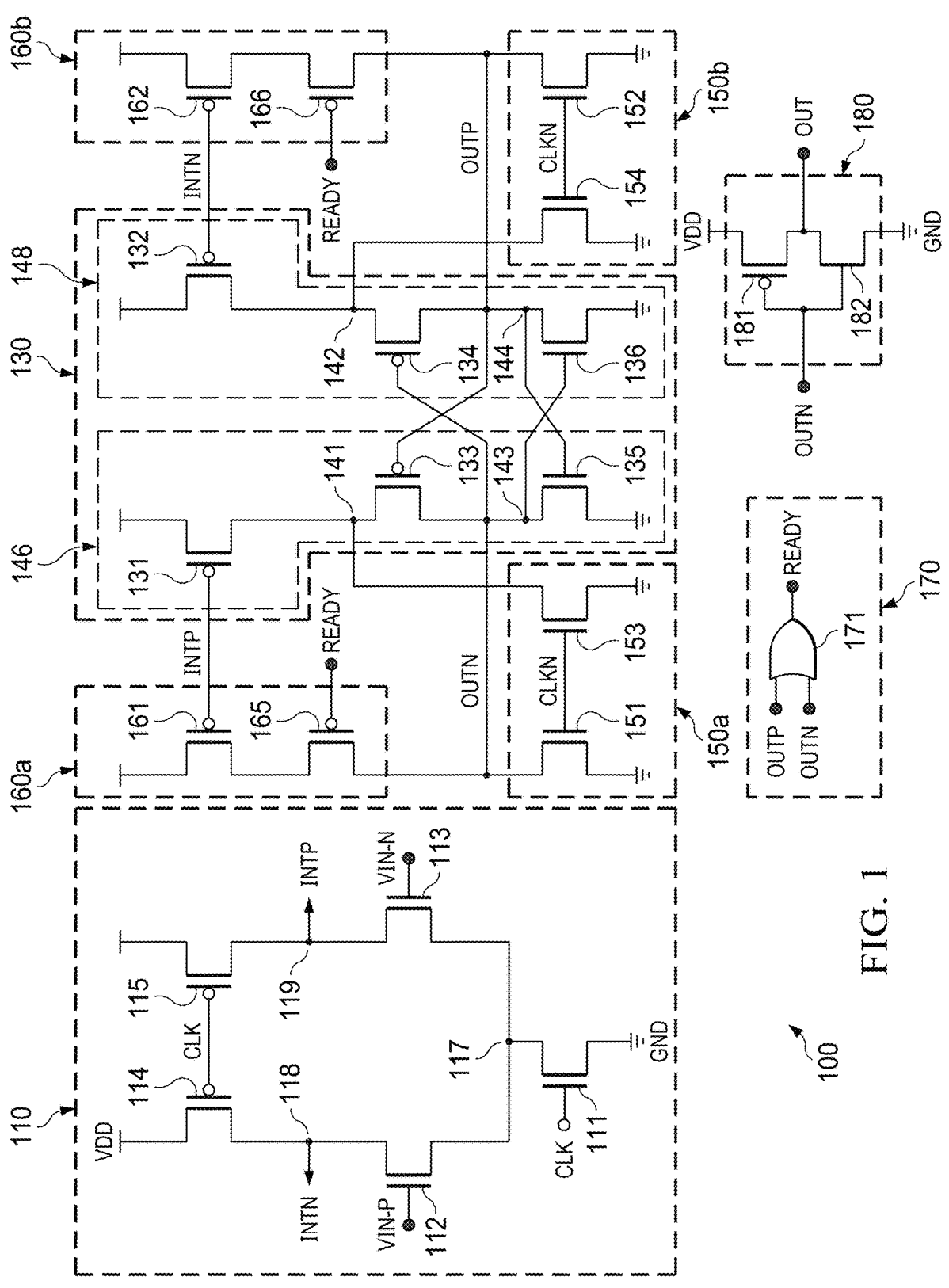

FIG. 1 illustrates a schematic diagram of a dynamic comparator in accordance with embodiments of the present disclosure.

Figure 2:
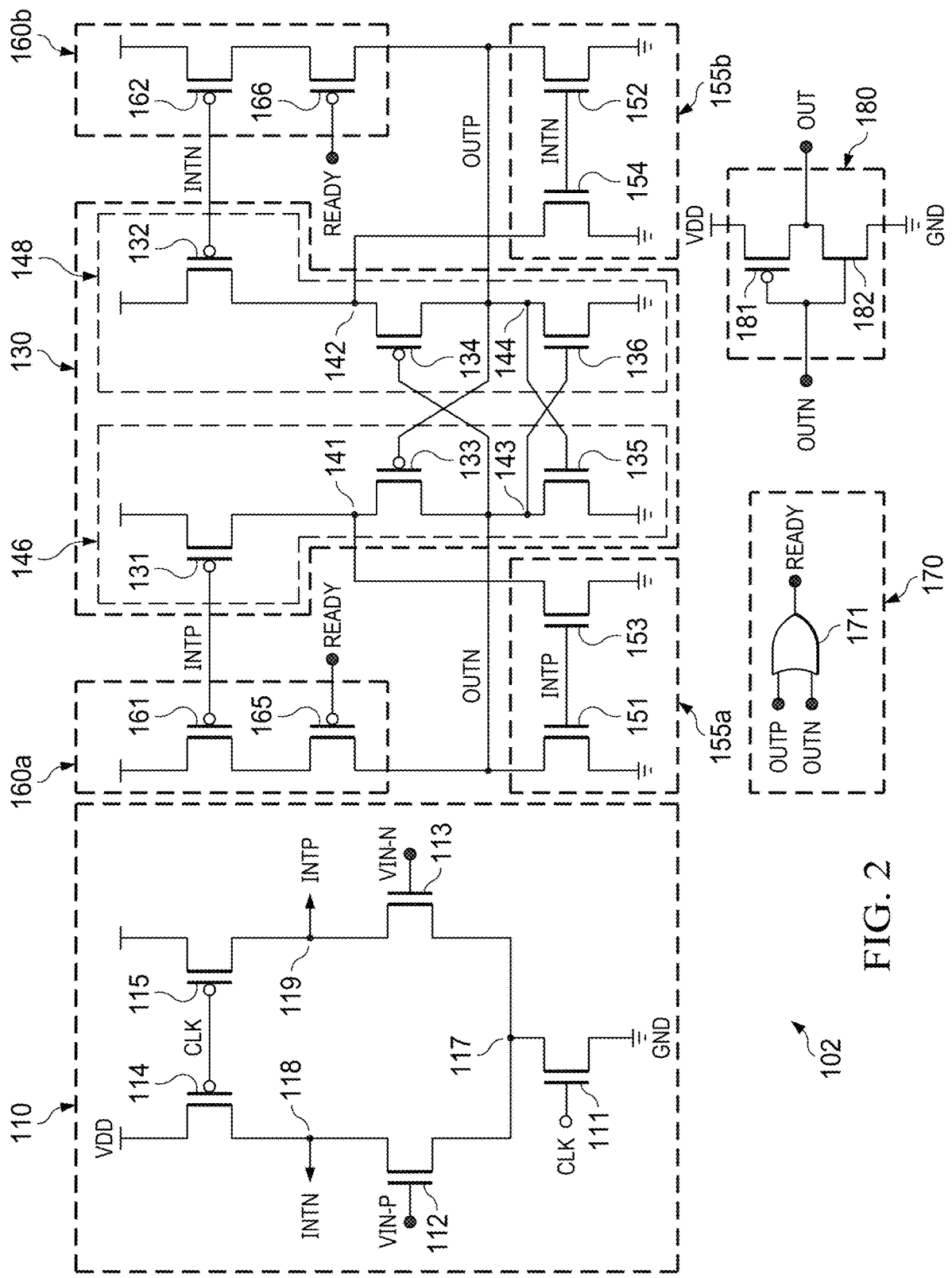

FIG. 2 illustrates a schematic diagram of a dynamic comparator in accordance with embodiments of the present disclosure.

Figure 3A:
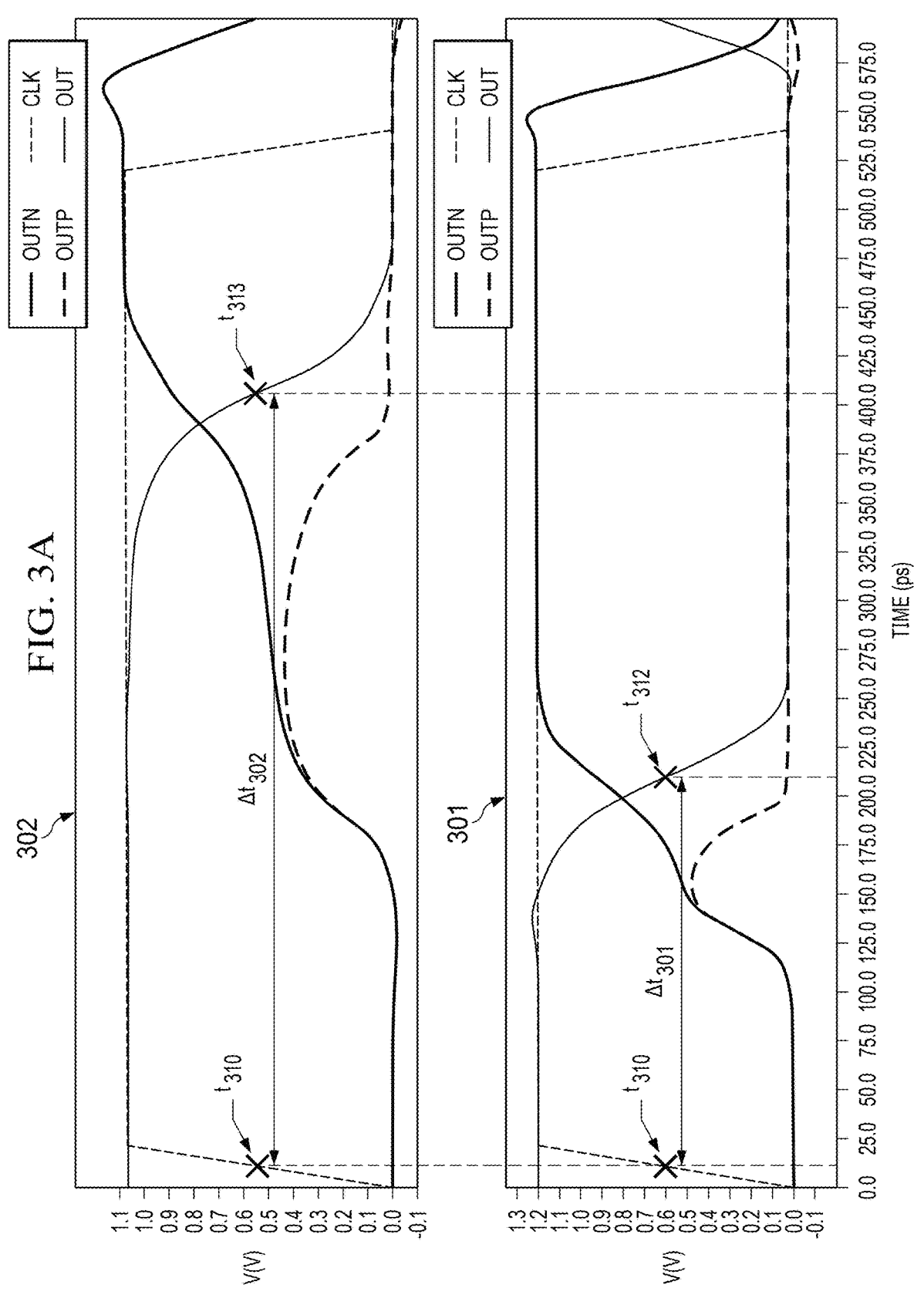
Figure 3B:
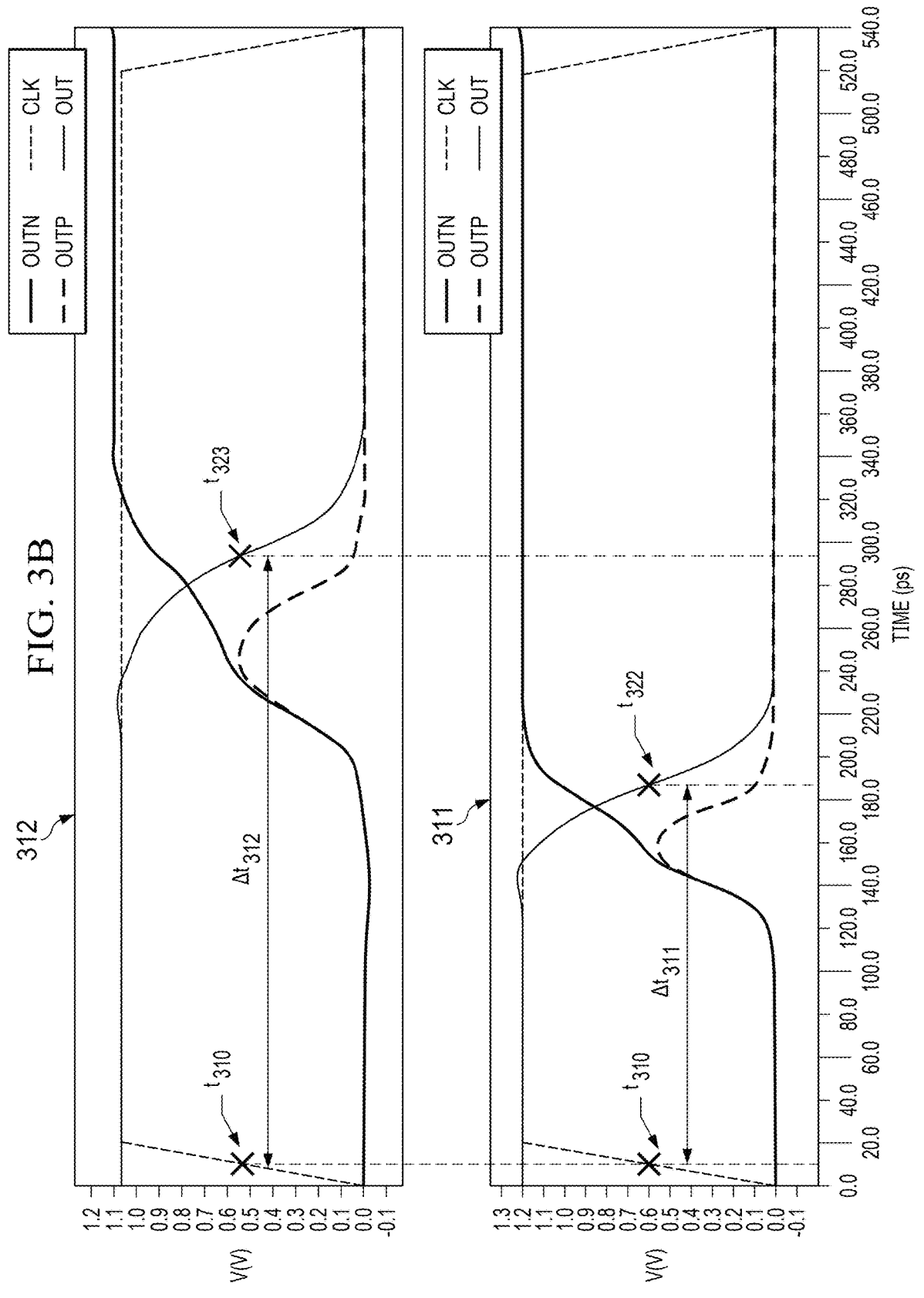

FIGS. 3A-3B illustrate plot diagrams of waveforms within a dynamic comparator in accordance with embodiments of the present disclosure.

FIG. 4 illustrates a method for performing a dynamic comparison in accordance with embodiments of the present disclosure.

DETAILED DESCRIPTION

Details of one or more embodiments are set forth in the description below and the accompanying drawings. Other features will be apparent from the description, drawings, and from the claims.

FIG. 1 illustrates a schematic diagram of comparator 100 in accordance with embodiments of the present disclosure. Comparator 100 may be a dynamic comparator including amplifier circuit 110, latch circuit 130, reset circuits 150a and 150b (collectively, reset circuit 150), boost circuits 160a and 160b (collectively, boost circuit 160), and ready circuit 170.

As described in further detail below, amplifier circuit 110 may amplify the difference between differential input signals VIN_N and VIN_P and may provide differential signals INTP and INTN to latch circuit 130. Latch circuit 130 may latch the differential output signals OUTN and OUTP according to the difference between INTP and INTN. The differential output signals OUTN and OUTP may serve as the differential output signals of comparator 100. Thus, for the purposes of the present disclosure, OUTN and OUTP may be referred to as the differential output signals of either latch circuit 130 or comparator 100. As shown in FIG. 1, comparator 100 may be supplied by a voltage supply rail VDD. In some embodiments, VDD may have a voltage of 1.2 volts. In other embodiments, VDD may have a voltage level of 1.0 volts, 1.5 volts, 1.8 volts, or any other voltage level suitable to supply low-voltage complimentary metal-oxide semiconductor (CMOS) circuitry.

Amplifier circuit 110 may be implemented in any suitable fashion according to the operation described in the present disclosure. In some embodiments, amplifier circuit 110 may include transistor 111, transistor 112, and transistor 113. In some embodiments, transistors 111, 112, and 113 may each be an N-type metal oxide semiconductor field-effect transistor ("NMOS transistor" or "N-type MOSFET"). Amplifier circuit 110 may also include transistor 114 and transistor 115. In some embodiments, transistors 114 and 115 may each be a P-type metal oxide semiconductor field-effect transistor ("PMOS transistor" or "P-type MOSFET").

NMOS transistors 112 and 113 may form a differential pair with gates coupled to first and second differential inputs of amplifier circuit 110. For example, NMOS transistor 112 may have a gate coupled to a first differential input of the amplifier circuit for receiving the VIN_P signal, and NMOS transistor 113 may have a gate coupled to a second differential input of the amplifier circuit for receiving the VIN_N signal. The sources of NMOS transistors 112 and 113 may be coupled together at node 117. NMOS transistors 112 and 113 may be configured to match each other. For example, the NMOS transistors 112 and 113 may have matching channel width-to-length (W/L) ratios. In some embodiments, the drains of NMOS transistors 112 and 113 may be respectively coupled to the differential amplifier outputs of amplifier circuit 110 at nodes 118 and 119. For example, the drain of NMOS transistor 113 may be coupled to a first differential amplifier output at node 119, and the drain of NMOS transistor 112 may be coupled to a second differential amplifier output at node 118. For the purposes of the present disclosure, the differential amplifier output signals INTN and INTP generated at the differential outputs of amplifier circuit 110 may also be referred to as intermediate output signals INTN and INTP because they are intermediate signals provided by the output of amplifier circuit 110 to the input of latch circuit 130.

As shown in FIG. 1, amplifier circuit 110 may have a clock input to receive a first clock signal CLK, and may accordingly be clocked by the first clock signal CLK. For example, NMOS transistor 111 may have a gate coupled to receive the CLK signal, a source coupled to ground GND, and a drain coupled to the sources of NMOS transistors 112 and 113 at node 117. Moreover, PMOS transistors 114 and 115 may both include gates coupled to receive the CLK signal and sources coupled to a voltage supply rail VDD. The drain of PMOS transistor 114 may be coupled to the drain of NMOS transistor 112 at node 118, and the drain of PMOS transistor 115 may be coupled to the drain of NMOS transistor 113 at node 119.

The clock signal CLK may alternate between a logic-low state and a logic-high state. In some embodiments, the logic-low state of CLK may be a first state that corresponds to an inactive phase of comparator 100 and the circuitry therein, and the logic-high state of CLK may be a second state that corresponds to an active phase of comparator 100 and the circuitry therein.

When CLK is in a logic-low state, amplifier circuit 110 may be inactive. For example, when CLK is in a logic-low state, NMOS transistor 111 may turn off, thereby blocking the pull-down path from NMOS transistors 112 and 113 to ground GND. Moreover, when CLK is in a logic-low state, PMOS transistors 114 and 115 may turn on, and may thus pull INTN and INTP high to the voltage level of VDD.

When CLK is in a logic-high state, amplifier circuit 110 may be active. For example, when CLK is in a logic-high state, PMOS transistors 114 and 115 may turn off, and NMOS transistor 111 may turn on. At the beginning of the active phase, the voltage signals INTN and INTP may initially be held at the voltage level of VDD by the parasitic capacitance at nodes 118 and 119. As the active phase progresses, NMOS transistors 112 and 113 may discharge nodes 118 and 119, thus pulling INTN and INTP low. Due to the configuration of NMOS transistors 112 and 113 as a differential pair driven by the differential input signals VIN_P and VIN_N, NMOS transistors 112 and 113 may discharge the respective capacitances at nodes 118 and 119 at different respective rates according to the difference between VIN_P and VIN_N. Thus, the differential amplifier output voltage signals INTN and INTP may fall at different rates during the active phase according to the difference between VIN_P and VIN_N. And as described in further detail below, latch circuit 130 may latch the differential output of latch circuit 130 depending on the difference between INTN and INTP at the output of amplifier circuit 110.

Latch circuit 130 may be implemented in any suitable fashion according to the operation described in the present disclosure. In some embodiments, latch circuit 130 may include PMOS transistors 131 and 132, PMOS transistors 133 and 134, and NMOS transistors 135 and 136. PMOS transistors 131 and 132 may be respectively coupled to receive the differential outputs of amplifier circuit 110. For example, PMOS transistor 131 may have a source coupled to VDD, a drain coupled to node 141, and a gate coupled to the first differential amplifier output at node 119, and may thus receive the INTP signal. Further, PMOS transistor 132 may have a source coupled to VDD, a drain coupled to node 142, and a gate coupled to the second differential amplifier output at node 118, and may thus receive the INTN signal. PMOS transistors 131 and 132 may thus serve as a pseudo-differential pair configured to amplify the differential amplifier output voltage signals INTP and INTN.

As shown in FIG. 1, PMOS transistor 131, PMOS transistor 133, and NMOS transistor 135 may form a first leg 146 of latch circuit 130. Similarly, PMOS transistor 132, PMOS transistor 134, and NMOS transistor 136 may form a second leg 148 of latch circuit 130. As described herein, PMOS transistor 131 may have a gate coupled to receive INTP from a first differential amplifier output and in response may provide a current to drive the first leg 146 of latch circuit 130 during the latching process. Similarly, PMOS transistor 132 may have a gate coupled to receive INTN from the second differential amplifier output and in response may provide a current to drive the second leg 148 of latch circuit 130 during the latching process.

PMOS transistor 133 and PMOS transistor 134 may have a cross-coupled configuration relative to each other. For example, PMOS transistor 133 may have a source coupled to the drain of PMOS transistor 131 at node 141, a drain coupled to the drain of PMOS transistor 131 at node 141, a drain coupled to node 143, and a gate coupled to node 144. Meanwhile, PMOS transistor 134 may have a source coupled to the drain of PMOS transistor 132 at node 142, a drain coupled to node 144, and a gate coupled to node 143. NMOS transistor 135 and NMOS transistor 136 may likewise have a cross-coupled configuration relative to each other. For example, NMOS transistor 135 may have a drain coupled to the drain of PMOS transistor 133 at node 143, a source coupled to ground GND, and a gate coupled to node 144. Meanwhile, NMOS transistor 136 may have a drain coupled to the drain of PMOS transistor 134 at node 144, a source coupled to ground GND, and a gate coupled to node 143.

As described above, CLK may be in a logic-low state during the inactive phase of comparator 100. Amplifier circuit 110 may thus pull INTP and INTN high to the voltage level of VDD during the inactive phase. And in turn, the high voltage level of INTP and INTN may turn off PMOS transistors 131 and 132 of latch circuit 130. Thus, during this inactive phase, the conduction path between VDD and the internal nodes of latch circuit 130 may be blocked.

Reset circuit 150 may reset the voltage levels of the nodes internal to latch circuit 130 during the inactive phase of comparator 100. Reset circuit 150 may be implemented in any suitable fashion according to the operation described in the present disclosure. In some embodiments, reset circuit 150 may include a plurality of reset transistors, including for example NMOS transistors 151, 152, 153, and 154. Each of NMOS transistors 151, 152, 153, and 154 may include a gate coupled to receive a second clock signal CLKN, and a source coupled to ground. The second clock signal CLKN may be the inverse of the first clock signal CLK and may thus also be referred to as an inverse clock signal CLKN for the purposes of the present disclosure. As shown in FIG. 1, the drains of NMOS transistors 151, 152, 153, and 154, may be respectively coupled to nodes 143, 144, 141, and 142. Moreover, during the inactive phase, the inverse clock signal CLKN may be in a logic-high state and may thus turn on each of NMOS transistors 151, 152, 153, and 154. Accordingly, NMOS transistors 151, 152, 153, and 154 may respectively pull nodes 143, 144, 141, and 142 low to a reset voltage level, for example to ground GND, during the inactive phase.

As described above, the reset transistors including NMOS transistors 151, 152, 153, and 154 may be used to pull the internal nodes of latch circuit 130 to ground GND during the inactive phase of comparator 100. Conversely, the reset transistors including NMOS transistors 151, 152, 153, and 154 may be disabled during the active phase of comparator 100 when the inverse clock signal CLKN is in a logic-low state. Thus, in some embodiments, reset transistors including NMOS transistors 151, 152, 153, and 154 may be configured to have minimal sizes smaller, for example, than those of the active devices within latch circuit 130. In some embodiments, NMOS transistors 151, 152, 153, and 154 may be sized, for example, with the minimum channel width and length allowed by the semiconductor process used to manufacture comparator 100.

Latch circuit 130, and in particular the first leg 146 and second leg 148 of latch circuit 130, may be configured to latch the differential output of comparator 100 during the active phase of comparator 100. For example, during the active phase, CLK may be in a logic-high state and CLKN may be in a logic-low state. With CLKN in a logic-low state, each of the NMOS transistors 151, 152, 153, and 154 of reset circuit 150 may be off. Moreover, as described above, with reference to amplifier circuit 110, when comparator 100 transitions from an inactive phase to an active phase, amplifier circuit 110 may cause INTP and INTN at the differential amplifier outputs to fall at different rates based on the difference between VIN_P and VIN_N. As INTP and INTN fall to voltage levels less than VDD minus the gate-to-source threshold of PMOS transistors 131 and 132, PMOS transistors 131 and 132 may begin to turn on and to conduct current from VDD to nodes 141 and 142 respectively. Because the voltages of INTP and INTN may fall at different rates during the active phase, the conduction of current by PMOS transistor 131 and PMOS transistor 132 may likewise increase at different rates.

The cross-coupled configurations of transistors in first leg 146 and second leg 148 of the latch circuit may provide positive feedback that causes latch circuit 130 to latch OUTP and OUTN at the first and second differential outputs of latch circuit 130 based on the difference between INTP and INTN. Specifically, the cross-coupled configurations of PMOS transistors 133 and 134 and of NMOS transistors 135 and 136 may provide positive feedback that causes latch circuit 130 to latch OUTP and OUTN based on the difference between INTP and INTN. For example, if VIN_N is higher than VIN_P, amplifier circuit 110 may cause the voltage level of INTP to fall at a faster rate than the voltage level INTN. As the voltage level of INTP falls at a faster rate than INTN, PMOS transistor 131 may conduct more current than PMOS transistor 132. Accordingly, the voltage at node 141, and the voltage of OUTN at node 143, may rise more quickly than the voltage at node 142, and the voltage of OUTP at node 144. As the voltage of OUTN at node 143 continues to increase to a voltage higher than that of OUTP at node 144, positive feedback may latch OUTN at a logic-high level and OUTP at a logic-low level. For example, as the voltage of OUTN increases, OUTN may drive NMOS transistor 136 on, and may drive PMOS transistor 134 off, thus causing the voltage of OUTP to fall toward ground GND. The low voltage of OUTP may turn off NMOS transistor 135 and may further turn on PMOS transistor 133, thus latching OUTN at a logic-high voltage level equal to VDD. In turn, the high voltage of OUTN may further turn off PMOS transistor 134 and further turn on NMOS transistor 136, thus latching OUTP at a logic-low voltage level equal to ground GND.

The example above describes a scenario where VIN_N is higher than VIN_P and thus comparator 100 latches OUTN high and OUTP low during the active phase. However, the circuitry of amplifier circuit 110 and latch circuit 130 is symmetric, and thus comparator 100 may also latches OUTN low and OUTP high when VIN_N is lower than VIN_P. For example, if VIN_P is higher than VIN_N, amplifier circuit 110 may cause the voltage level of INTN to fall at a faster rate than INTP during the active phase. As the voltage level of INTN falls at a faster rate than the voltage level of INTP, PMOS transistor 132 may conduct more current than PMOS transistor 131. Accordingly, the voltage at node 142, and the voltage of OUTP at node 144, may rise more quickly than the voltage at node 141, and the voltage of OUTN at node 143. As the voltage of OUTP at node 144 continues to increase to a voltage higher than that of OUTN at node 143, positive feedback may latch OUTP at a logic-high level and OUTN at a logic-low level. For example, as the voltage of OUTP increases, OUTP may drive NMOS transistor 135 on, and may drive PMOS transistor 133 off, thus causing the voltage of OUTN to fall toward ground. The low voltage of OUTN may turn off NMOS transistor 136 and may further turn on PMOS transistor 134, thus latching OUTP at a logic-high voltage level equal to VDD. In turn, the high voltage of OUTP may further turn off PMOS transistor 133 and further turn on NMOS transistor 135, thus latching OUTN at a logic-low voltage level equal to ground GND.

As shown in FIG. 1, comparator 100 may also include boost circuit 160. Boost circuit 160 may provide additional current paths from VDD to the differential outputs of latch circuit 130 at nodes 143 and 144. Boost circuit 160 may be implemented in any suitable fashion according to the operation described in the present disclosure. In some embodiments, boost circuit 160a may include PMOS transistor 161 and PMOS transistor 165. PMOS transistor 161 may have a source coupled to VDD and a gate coupled to receive INTP from the first differential amplifier output. PMOS transistor 165 may include a source coupled to the drain of PMOS transistor 161, a drain coupled to a first differential output of latch circuit 130 at node 143, and a gate coupled to receive the READY signal. PMOS transistor 165 may serve as a pass transistor for a first conduction path including PMOS transistor 161, and thus PMOS transistor 165 may also be referred to as a first pass transistor for the purposes of the present disclosure. Boost circuit 160b may include PMOS transistor 162 and PMOS transistor 166. PMOS transistor 162 may have a source coupled to VDD and a gate coupled to receive INTN from the second differential amplifier output. PMOS transistor 166 may include a source coupled to the drain of PMOS transistor 162, a drain coupled to a second differential output of latch circuit 130 at node 144, and a gate coupled to receive the READY signal. PMOS transistor 166 may serve as a pass transistor for a second conduction path including PMOS transistor 162, and thus PMOS transistor 166 may also be referred to as a second pass transistor for the purposes of the present disclosure.

As described in further detail below with reference to ready circuit 170, the READY signal may be held at a logic-low level at the beginning of the active phase, thereby driving PMOS transistors 165 and 166 in an on-state. Thus, PMOS transistor 161 may provide a first supplemental current via an additional current path, driven by INTP, from VDD to the first differential output of latch circuit 130 at node 143. Likewise, PMOS transistor 162 may provide a second supplemental current via an additional current path, driven by INTN, from VDD to the second differential output of latch circuit 130 at node 144. The supplemental currents provided by PMOS transistors 161 and 162 may boost the speed at which latch circuit 130 latches the differential output voltages OUTN and OUTP at the first and second differential outputs of latch circuit 130 during the active phase of comparator 100. Thus, for the purposes of the present disclosure, PMOS transistors 161 and 162 may also be referred to as the first and second boost transistors of boost circuit 160. As the voltages of INTP and INTN fall at different rates during the active phase of comparator 100, the different supplemental currents provided by PMOS transistors 161 and 162 to the first leg 146 and the second leg 148 of latch circuit 130 may provide a further difference in the total current provided to the differential outputs of latch circuit 130 at nodes 143 and 144. The additional current difference may thus speed up the rate at which the voltages of OUTN and OUTP begin to separate thus improving the speed with which the positive feedback of latch circuit 130 latches OUTN and OUTP at the first and second differential outputs of latch circuit 130.

The improvement may be more pronounced during conditions that would otherwise cause latch circuit 130 to slow. For example, in embodiments with a designed VDD voltage of 1.2 volts, low VDD conditions may cause VDD to be, for example, approximately 1.1 volts. The lower VDD may provide less headroom between VDD and ground GND for the three levels of transistors in latch circuit 130, including PMOS transistors 131 and 132, PMOS transistors 133 and 134, and NMOS transistors 135 and 136, to operate. The reduced headroom between VDD and ground GND may slow the rate at which latch circuit 130 may otherwise latch OUTN and OUTP. However, the supplemental current provided by PMOS transistors 161 and 162 of boost circuit 160 may be less susceptible to VDD variation than the current provided by PMOS transistors 131 and 132 of latch circuit 130. For example, at the beginning of the active phase, PMOS transistors 165 and 166 of boost circuit 160 may be driven in a fully-on saturation state by a READY signal at a logic-low level. Thus, as compared to PMOS transistors 131, 132, 133, and 134 of latch circuit 130, PMOS transistors 161 and 162 of boost circuit 160 may require less headroom between VDD and the differential output of latch circuit 130 at nodes 143 and 144. The differential current provided by PMOS transistors 161 and 162 of boost circuit 160 may thus be less susceptible to a low VDD voltage as compared to PMOS transistors 131, 132, 133, and 134 of latch circuit 130. Boost circuit 160 may thus improve the speed with which latch circuit 130 would otherwise latch during the active phase under low VDD conditions.

Boost circuit 160 may also improve the speed with which latch circuit 130 would otherwise latch under various other conditions that would slow latch 130. For example, various conditions, such as semiconductor process variation and cold temperature may also cause the respective thresholds of PMOS transistors 131, 132, 133, and 134, and NMOS transistors 135 and 136, to be larger and thus susceptible to limited headroom as described above. The larger thresholds may thus cause latch circuit 130 to react more slowly to the falling voltages of INTP and INTN during the active phase, and thereby to latch more slowly. During such conditions, the supplemental current provided by boost circuit 160 may increase the difference in the total current being provided respectively to nodes 143 and 144 of latch circuit 130, thus improving the speed at which latch circuit 130 would otherwise latch the differential output voltages OUTN and OUTP.

As described above with reference to amplifier circuit 110, CLK may be in a logic-low state during the inactive phase of comparator 100. Thus, NMOS transistor 111 may be driven in an off-state, thereby preventing amplifier circuit 110 from consuming current during the inactive phase of comparator 100, notwithstanding any nominal semiconductor leakage currents. During the inactive phase, INTN and INTP may also be held at a logic-high level approximately equal to VDD. INTN and INTP may thus drive each of PMOS transistors 131 and 132 of latch circuit 130, and PMOS transistors 161 and 162 of boost circuit 160, in an off state during the inactive phase. Accordingly, latch circuit 130 and boost circuit 160 may likewise be prevented from consuming current during the inactive phase of comparator 100, notwithstanding any nominal semiconductor leakage currents.

As also described above, the voltage levels of INTN and INTP may begin to fall at different rates at the beginning of the active phase of comparator 100. PMOS transistors 131 and 132 may thus conduct current until latch circuit 130 latches the differential output. For example, if OUTN is latched at a logic-high level and OUTP is latched at a logic-low level, PMOS transistor 134 and NMOS transistor 135 may both be held by the latch in an off-state. On the other hand, if OUTN is latched at a logic-low level, and OUTP is latched at a logic-high level, PMOS transistor 133 and NMOS transistor 136 may both be held in an off-state. Thus, once the latch circuit 130 latches the differential output one way or the other, latch circuit 130 may consume no current, notwithstanding any nominal semiconductor leakage currents.

As shown in FIG. 1, comparator 100 may also include ready circuit 170. Ready circuit 170 may be implemented in any suitable fashion according to the operation described in the present disclosure. In some embodiments, ready circuit 170 may include a logic circuit, such as OR-gate 171. OR-gate 171 may perform a logical-OR function to generate the READY signal at its output. In some embodiments, OR-gate 171 may have a first input coupled to the first differential output of the latch circuit to receive the OUTN signal, a second input coupled to the second differential output of the latch circuit to receive the OUTP signal, and an output coupled to provide a READY signal to the gates of PMOS transistors 165 and 166. As described in further detail below, ready circuit 170 may detect whether the first and second differential outputs of latch circuit 130 have latched, and may provide the READY signal to ensure that boost circuit 160 does not consume current after latch circuit 130 has latched during the active phase of comparator 100. Accordingly, boost circuit 160 may provide the advantages described above while maintaining the efficiency of comparator 100 as a whole.

As described above, OUTP and OUTN may be held low during the inactive phase, and may begin to rise during the active phase until latch circuit 130 latches one of OUTP and OUTN at a logic-high level and the other of OUTP and OUTN at a logic-low level. At the beginning of the active phase, and prior to one of OUTP and OUTN reaching a logic-high level, OR-gate 171 may drive the READY signal at a logic-low level. When the READY signal is at a logic-low level, the READY signal may drive PMOS transistors 165 and 166 in an on-state, thereby allowing boost circuit 160 to provide the first and second supplemental currents from PMOS transistors 161 and 162 to the first and second differential outputs of latch circuit 130 at nodes 143 and 144. Subsequently, when one of OUTP and OUTN reaches a logic-high level, for example when latch circuit 130 has latched the first and second differential outputs, OR-gate 171 may drive the READY signal at a logic-high level to indicate that latch circuit 130 has latched. The logic-high level of the READY signal may drive PMOS transistors 165 and 166 in an off-state, thereby blocking the first supplemental current from PMOS transistor 161 and the second supplemental current from PMOS transistor 162 in response to the indication that the first and second differential outputs of the latch circuit have been latched. Thus, like latch circuit 130, boost circuit 160 may be prevented from consuming current after latch circuit 130 has latched during the active phase of comparator 100. Boost circuit 160 may thus provide the advantages described above while also maintaining the efficiency of latch circuit 130 and comparator 100 as a whole.

FIG. 2 illustrates a schematic diagram of comparator 102 in accordance with embodiments of the present disclosure. Comparator 102 of FIG. 2 may be a dynamic comparator similar in certain respects to comparator 100 of FIG. 1. Thus, unless otherwise described herein, the elements with like reference numbers in FIG. 2 may operate in a similar manner as described above for FIG. 1.

As shown in FIG. 2, comparator 100 may include reset circuit 155*a* and reset circuit 155*b* (collectively, reset circuit 155). In reset circuit 155, each of the reset transistors, including NMOS transistors 151, 152, 153, and 154, may be driven by one of the differential amplifier outputs of amplifier circuit 110. For example, NMOS transistors 151 and 153 of reset circuit 155$a$ may be coupled to the first differential amplifier output at node 119 of amplifier circuit 110, and may thus be driven by the INTP signal. NMOS transistors 152 and 154 of reset circuit 155$b$ may be coupled to the second differential amplifier output at node 118 of amplifier circuit 110, and may thus be driven by the INTN signal.

Multiple advantages may be realized by driving each of the reset transistors, including NMOS transistors 151, 152, 153, and 154, with one of the differential amplifier outputs of amplifier circuit 110. For example, the gate capacitance of NMOS transistors 151, 152, 153, and 154 may serve as a capacitive load. By driving that capacitive load with signals other than CLKN, the capacitive load may thus be removed from the clock circuit that generates the CLKN signal. Moreover, by driving each of the gates of NMOS transistors 151, 152, 153, and 154 with one of the differential outputs of the amplifier circuit, additional capacitance may be placed at the first and second differential amplifier outputs at nodes 119 and 118. The additional capacitance at the first and second differential amplifier outputs may have the benefit of suppressing noise within comparator 100.

Comparator 102 (and comparator 100) may be manufactured using a CMOS semiconductor manufacturing process that may provide for multiple different gate-to-source thresholds. For example, comparator 102 may be manufactured using a CMOS semiconductor manufacturing process that may provide NMOS and PMOS transistor options with low, standard, and high gate-to-source thresholds.

In some embodiments, NMOS transistors 151, 152, 153, and 154 of reset circuit 155 may be configured with a higher gate-to-source threshold voltage than, for example, NMOS transistors 135 and 136 of latch circuit 130. For example, NMOS transistors 135 and 136 may be configured with a low or a standard gate-to-source threshold voltage, and NMOS transistors 151, 152, 153, and 154 of reset circuit 155 may be configured with a high gate-to-source threshold voltage. Accordingly, as the voltages of INTP and INTN begin to fall at the beginning of the active phase, the reset transistors, including NMOS transistors 151, 152, 153, and 154, may turn off before PMOS transistors 131 and 132, and PMOS transistors 161 and 162, turn on. In other words, the reset transistors including NMOS transistors 151, 152, 153, and 154 may be configured with a high gate-to-source voltage threshold that is greater than VDD minus the gate-to-source threshold of PMOS transistors 131, 132, 161, and 162. Such an arrangement ensures that the reset transistors including NMOS transistors 151, 152, 153, and 154 turn off and block any current conduction through reset circuit 155 prior to the point at which PMOS transistors 131 and 132 of latch circuit 130, and PMOS transistors 161 an 162 of boost circuit 160, begin to conduct current during the active phase of comparator 102. Thus, the high thresholds of the NMOS transistors 151, 152, 153, and 154 prevent any unwanted shoot-through current during the active phase of comparator 102.

FIGS. 3A-3B illustrate plot diagrams of waveforms within a dynamic comparator in accordance with embodiments of the present disclosure. FIGS. 3A-3B collectively illustrate the benefit of boost circuit 160. Specifically, FIG. 3A illustrates plot diagrams of waveforms within a dynamic comparator similar to comparator 102, but with boost circuit 160 disabled. Meanwhile, FIG. 3B illustrates plot diagrams of waveforms within comparator 102, which includes boost circuit 160.

FIGS. 3A-3B illustrate the clock signal CLK rising from a logic-low level to a logic-high level equal to VDD to begin the active phase of the comparator. As shown in FIGS. 3A-3B, the differential output signals OUTN and OUTP may initially rise and then separate, for example, as OUTN latches high and OUTP latches low. The single-ended OUT signal may represent, for example, the output of a logic circuit coupled to one of the differential output signals OUTP or OUTN. For example, referring back to FIGS. 1-2, comparator 100 and comparator 102 may include logic circuit 180. In some embodiments, logic circuit 180 may be a CMOS inverter, with PMOS transistor 181 coupled between VDD and the output of the inverter, and NMOS transistor 182 coupled between the output of the inverter and ground GND. The input of logic circuit 180 may be coupled to receive one of the differential output signals of latch circuit 130, for example OUTN. In some embodiments, logic circuit 180 may be considered part of comparator 100 or comparator 102. In other embodiments, logic circuit 180 may be considered a separate logic circuit coupled to receive one of the differential output signals OUTN or OUTP of latch circuit 130.

In FIG. 3A, plot 301 illustrates the timing of a comparator similar to comparator 102 but with boost circuit 160 disabled, and under normal conditions including VDD of 1.2 volts, room temperature, and no semiconductor process variation. Plot 302 illustrates the timing of a comparator similar to comparator 102 but with boost circuit 160 disabled, and under slow conditions including a low VDD of approximately 1.08 volts, cold temperature of approximately −40 degrees Celsius, and worst-case semiconductor process variation. In FIG. 3B, plot 311 illustrates the timing of comparator 102 with boost circuit 160 under normal conditions, including VDD at 1.2 volts, room temperature, and no semiconductor process variation. Plot 312 illustrates the timing of comparator 102 with boost circuit 160 under slow conditions, including a low VDD of approximately 1.08 volts, cold temperature of approximately −40 degrees Celsius, and worst-case semiconductor process variation.

For the purposes of the present disclosure, the speed of a comparator with boost circuit 160 disabled (FIG. 3A) and the speed of comparator 102 with boost circuit 160 enabled (FIG. 3B) can be measured from a time at which the rising CLK signal reaches one-half of VDD to a time at which the falling OUT signal reaches one-half of VDD.

As shown in plot 301 of FIG. 3A, for the comparator with boost circuit 160 disabled and under normal conditions, CLK reaches one-half VDD at a time $t_{310}$ of approximately 10 pico-seconds. The OUTN and OUTP signals begin to separate at approximately 160 pico-seconds, and OUT reaches one-half VDD at a time $t_{312}$ of approximately 210 pico-seconds. Thus, under normal conditions, the comparator with boost circuit 160 disabled has a transition time $\Delta t_{301}$ of approximately 200 pico-seconds. As shown in plot 302 of FIG. 3A, for the comparator with boost circuit 160 disabled and under slow conditions, CLK reaches one-half VDD at a time $t_{310}$ of approximately 10 pico-seconds. The OUTN and OUTP signals begin to separate at approximately 260 pico-seconds, and OUT reaches one-half VDD at a time $t_{313}$ of approximately 410 pico-seconds. Thus, under slow conditions, the comparator with boost circuit 160 disabled has a transition time $\Delta t_{302}$ of approximately 400 pico-seconds. Moreover, as is shown in plot 302 and plot 301 of FIG. 3A, the additional delay incurred under slow conditions is largely due to the additional time it takes for OUTN and OUTP to fully separate during the latching phase under slow conditions as opposed to the time it takes for OUTN and OUTP to fully separate during the latching phase under normal conditions.

As shown in plot 311 of FIG. 3B, for comparator 102 with boost circuit 160 enabled and under normal conditions, CLK reaches one-half VDD at a time $t_{310}$ of approximately 10 pico-seconds. The OUTN and OUTP signals begin to separate at approximately 155 pico-seconds, and OUT reaches one-half VDD at a time $t_{322}$ of approximately 190 pico-seconds. Thus, under normal conditions, comparator 102 with boost circuit 160 has a transition time $\Delta t_{311}$ of approximately 180 pico-seconds. As shown in plot 312 of FIG. 3B, for comparator 102 with boost circuit 160 enabled and under slow conditions, CLK reaches one-half VDD at a time $t_{310}$ of approximately 10 pico-seconds. The OUTN and OUTP signals begin to separate at approximately 245 pico-seconds, and OUT reaches one-half VDD at a time $t_{323}$ of approximately 295 pico-seconds. Thus, under slow conditions, the comparator with boost circuit 160 has a transition time $\Delta t_{312}$ of approximately 285 pico-seconds.

As illustrated by FIGS. 3A-3B, the inclusion of boost circuit 160 may improve the speed with which latch circuit 130 latches the first and second differential outputs of latch circuit 130. In some embodiments, the speed improvement may be more pronounced during slow conditions, such as low VDD voltage, cold temperature, and/or semiconductor process variation as compared to during normal conditions. For example, as shown by the $\Delta t_{311}$ of approximately 180 pico-seconds in plot 311 (FIG. 3B) as compared to the $\Delta t_{301}$ of approximately 200 pico-seconds in plot 301 (FIG. 3A), the inclusion of boost circuit 160 within comparator 102 may improve the speed of comparator 102 by approximately 20 pico-seconds under normal conditions. Meanwhile, as shown by the $\Delta t_{312}$ of approximately 285 pico-seconds in plot 312 (FIG. 3B) as compared to the $\Delta t_{302}$ of approximately 400 pico-seconds in plot 302 (FIG. 3A), the inclusion of boost circuit 160 within comparator 102 may improve the speed of comparator 102 by approximately 115 pico-seconds under slow conditions.

In sum, the inclusion of boost circuit 160 in comparator 102 may improve the speed of comparator 102, including by approximately thirty percent under slow conditions. Moreover, as described above with reference to FIG. 1 and FIG. 2, boost circuit 160 may be configured to consume no current after the output of comparator 102 has latched, and thus contributes no static current consumption. Thus, the speed improvement may be achieved without adding static current consumption, and while maintaining the efficiency of comparator 102 as a whole. Thus, comparator 102 may improve the speed and efficiency of larger circuits, such as ADCs, in which one or more instances of comparator 102 may be incorporated.

As described above with reference to FIG. 1 and FIG. 2, latch circuit 130 and boost circuit 160 may operate in a similar manner in both comparator 100 (shown in FIG. 1) and comparator 102 (shown in FIG. 2). Thus, although FIGS. 3A-3B illustrates the speed improvement provided by boost circuit 160 for comparator 102, a similar speed improvement may be realized by boost circuit 160 in comparator 100.

FIG. 4 illustrates operation of an example method 400 for performing a dynamic comparison in accordance with embodiments of the present disclosure. Method 400 may be performed by any suitable mechanism, such as amplifier circuit 110, latch circuit 130, reset circuit 150, boost circuit 160, and ready circuit 170, or any suitable combination thereof. Method 400 may be performed with fewer or more steps than shown in FIG. 4. Moreover, steps of method 400 may be omitted, repeated, performed in parallel, performed in a different order than shown in FIG. 4, or performed recursively. One or more steps of method 400, although shown in an order, may be performed at the same time or in a re-ordered manner.

At step 402, a difference between first and second differential inputs may be amplified to generate first and second differential amplifier outputs. For example, during an active phase, amplifier circuit 110 may amplify the difference between the differential input signals VIN_P and VIN_N signals received at the first and second differential inputs of amplifier circuit 110. Based on the difference between VIN_P and VIN_N, amplifier circuit 110 may generate the INTP and INTN signals at the first and second differential amplifier outputs at nodes 119 and 118 respectively.

At step 404, a gate of a first transistor included in a first leg of a latch circuit may be driven with the first differential amplifier output. For example, the gate of PMOS transistor 131 included in the first leg 146 of latch circuit 130 may have a gate coupled to the first differential amplifier output at node 119, and thus may be driven by the INTP signal at the first differential amplifier output.

At step 406, a gate of a second transistor included in a second leg of a latch circuit may be driven with the second differential amplifier output. For example, the gate of PMOS transistor 132 included in the second leg 148 of latch circuit 130 may have a gate coupled to the second differential amplifier output at node 118, and thus may be driven by the INTN signal at the second differential amplifier output.

At step 408, a first supplemental current may be provided to a first differential output of the latch circuit with a first boost transistor having a gate coupled to the first differential amplifier output. For example, the gate of PMOS transistor 161, which may also be referred to as a first boost transistor for the purposes of the present disclosure, may have a gate coupled to the first differential amplifier output at node 119 of amplifier circuit 110, and may thus receive the INTP signal from the first differential amplifier output. Based on the INTP signal, PMOS transistor 161 may provide a first supplemental current to the first differential output of latch circuit 130 during the active phase.

At step 410, a second supplemental current may be provided to a second differential output of the latch circuit with a second boost transistor having a gate coupled to the second differential amplifier output. For example, the gate of PMOS transistor 162, which may also be referred to as a second boost transistor for the purposes of the present disclosure, may have a gate coupled to the second differential amplifier output at node 118 of amplifier circuit 110, and may thus receive the INTN signal from the second differential amplifier output. Based on the INTN signal, PMOS transistor 162 may provide a second supplemental current to the second differential output of latch circuit 130 during the active phase.

At step 412, the first and second differential outputs of the latch circuit may be latched based on a difference between the first and second differential amplifier outputs. For example, the OUTN and OUTP signals at the first and second differential outputs of latch circuit 130 may be latched, at opposing high and low voltages, or at opposing low and high voltages, based on the difference between the total current received from PMOS transistors 131 and 161 driven by the first differential amplifier output on the first side of latch circuit 130, and the total current received from PMOS transistors 132 and 162 driven by the second differential amplifier output on the second side of latch circuit 130.

At step 414, the first supplemental current and the second supplemental current may be blocked in response to an indication that the first and second differential outputs of the latch circuit have been latched. For example, once one of OUTN and OUTP is latched to a logic-high level, ready circuit 170 may drive the READY signal to a logic-high level to indicate that latch circuit 130 has latched. The logic-high level of the READY signal may turn off PMOS transistors 165 and 166 in boost circuit 160, thereby blocking the first and second supplemental currents from PMOS transistors 161 and 162 respectively.

Although examples have been described above, other modifications and variations may be made from this disclosure without departing from the spirit and scope of these examples. The above descriptions of various embodiments illustrate the principles of the invention. Numerous variations and modifications will become apparent to those skilled in the art based on the above disclosure. The following claims are intended to embrace all such variations and modifications.

What is claimed is:

1. A comparator, comprising:
an amplifier circuit configured to amplify a difference between a first differential input and a second differential input during an active phase of the comparator;
a latch circuit comprising:
  a first transistor coupled to a first differential amplifier output of the amplifier circuit and configured to drive a first leg of the latch circuit with a first drive current; and
  a second transistor coupled to a second differential amplifier output of the amplifier circuit and configured to drive a second leg of the latch circuit with a second drive current; and
  wherein the first leg and the second leg are configured to latch a first differential output and a second differential output of the latch circuit during the active phase; and
a boost circuit comprising:
  a first boost transistor having a gate coupled to a gate of the first transistor and a source coupled to a source of the first transistor, the first boost transistor configured to provide a first supplemental current to the first differential output of the latch circuit to supplement the first drive current during the active phase;
  a first pass transistor coupled in series with the first boost transistor and configured to block the first supplemental current in response to the latch circuit latching;
  a second boost transistor having a gate coupled to a gate of the second transistor and a source coupled to a source of the second transistor, the second boost transistor configured to provide a second supplemental current to the second differential output of the latch circuit to supplement the second drive current during the active phase; and
  a second pass transistor coupled in series with the second boost transistor and configured to block the second supplemental current in response to the latch circuit latching.

2. The comparator of claim 1, further comprising a logic circuit including:
a first input coupled to the first differential output of the latch circuit;

a second input coupled to the second differential output of the latch circuit; and
an output configured to indicate whether the latch circuit has latched the first and second differential outputs of the latch circuit.

3. The comparator of claim 2, wherein:
a gate of the first pass transistor is coupled to the output of the logic circuit; and
a gate of the second pass transistor is coupled to the output of the logic circuit.

4. The comparator of claim 2, wherein the logic circuit comprises an OR-gate.

5. The comparator of claim 1, further comprising a reset circuit including a plurality of reset transistors configured to drive a respective plurality of nodes of the latch circuit to a reset voltage level during an inactive phase of the comparator.

6. The comparator of claim 5, wherein each of the plurality of reset transistors is configured to be driven by a second clock signal that is inverse to a first clock signal received by the amplifier circuit.

7. The comparator of claim 5, wherein each of the plurality of reset transistors is configured to be driven by one of the first differential amplifier output and the second differential amplifier output.

8. A dynamic comparator, comprising:
an amplifier circuit comprising:
  a first differential input and a second differential input;
  a first differential amplifier output and a second differential amplifier output; and
  a clock input configured to receive a clock signal with a first state corresponding to an inactive phase of the dynamic comparator and a second state corresponding to an active phase of the dynamic comparator, the amplifier circuit configured to be inactive during the first state of the clock signal and configured to amplify a difference between the first differential input and the second differential input during the second state of the clock signal;
a latch circuit comprising:
  a first transistor having a gate coupled to the first differential amplifier output, the first transistor configured to drive a first leg of the latch circuit with a first drive current; and
  a second transistor having a gate coupled to the second differential amplifier output, the second transistor configured to drive a second leg of the latch circuit with a second drive current; and
  wherein the first leg and the second leg are configured to latch a first differential output and a second differential output of the latch circuit during the active phase of the dynamic comparator in response to the first and second differential amplifier outputs; and
a boost circuit comprising:
  a first boost transistor having a gate coupled to the first differential amplifier output and a source coupled to a source of the first transistor, the first boost transistor configured to provide a first supplemental current to the first differential output of the latch circuit to supplement the first drive current during the active phase;
  a first pass transistor coupled in series with the first boost transistor and configured to block the first supplemental current in response to the latch circuit latching;

a second boost transistor having a gate coupled to the second differential amplifier output and a source coupled to a source of the second transistor, the second boost transistor configured to provide a second supplemental current to the second differential output of the latch circuit to supplement the second drive current during the active phase; and a second pass transistor coupled in series with the second boost transistor and configured to block the second supplemental current in response to the latch circuit latching.

9. The dynamic comparator of claim 8, further comprising a logic circuit including:

a first input coupled to the first differential output of the latch circuit;

a second input coupled to the second differential output of the latch circuit; and an output configured to indicate whether the latch circuit has latched the first and second differential outputs of the latch circuit.

10. The dynamic comparator of claim 9 wherein:

the first pass transistor has a gate coupled to the output of the logic circuit; and the second pass transistor has a gate coupled to the output of the logic circuit.

11. The dynamic comparator of claim 9, wherein the logic circuit comprises an OR-gate.

12. The dynamic comparator of claim 8, further comprising a reset circuit including a plurality of reset transistors configured to drive a respective plurality of nodes of the latch circuit to a reset voltage level during the inactive phase of the comparator.

13. The dynamic comparator of claim 12, wherein each of the plurality of reset transistors is configured to be driven by an inverse clock signal.

14. The dynamic comparator of claim 12, wherein each of the plurality of reset transistors is configured to be driven by one of the first differential amplifier output and the second differential amplifier output.

15. A method for performing a dynamic comparison of a comparator, comprising:

amplifying a difference between a first differential input and a second differential input to generate a first differential amplifier output and a second differential amplifier output;

driving a gate of a first transistor included in a first leg of a latch circuit with the first differential amplifier output;

driving a gate of a second transistor included in a second leg of the latch circuit with the second differential amplifier output;

providing a first supplemental current to a first differential output of the latch circuit with a first boost transistor having a gate coupled to the first differential amplifier output and a source coupled to a source of the first transistor, the first supplemental current supplementing a first drive current provided to the first leg by the first transistor;

providing a second supplemental current to a second differential output of the latch circuit with a second boost transistor having a gate coupled to the second differential amplifier output and a source coupled to a source of the second transistor, the second supplemental current supplementing a second drive current provided to the second leg by the second transistor;

latching the first and second differential outputs of the latch circuit based on the first and second differential amplifier outputs;

detecting whether the first and second differential outputs of the latch circuit have been latched during an active phase of the comparator; and blocking the first supplemental current and the second supplemental current in response to detecting that the first and second differential outputs of the latch circuit have been latched.

16. The method of claim 15, wherein detecting whether the first and second differential outputs of the latch circuit have been latched comprises performing a logical-OR function on the first and second differential outputs of the latch circuit.

17. The method of claim 15, further comprising driving a plurality of nodes of the latch circuit to a reset voltage level during an inactive phase of the comparator.

18. The method of claim 17, further comprising driving a gate of each of a plurality of reset transistors with one of the first differential amplifier output and the second differential amplifier output during the inactive phase of the comparator.

* * * * *